(12) United States Patent
Patil et al.

(10) Patent No.: US 12,235,319 B2
(45) Date of Patent: Feb. 25, 2025

(54) SYSTEM AND METHOD FOR FAULT SEQUENCE RECORDING

(71) Applicant: Texas Instruments Incorporated, Dallas, TX (US)

(72) Inventors: Abhinay Patil, Bangalore (IN); Kavitha Balaramaiah, Bangalore (IN); Mahadev Gopalakrishnan, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/520,797

(22) Filed: Nov. 28, 2023

(65) Prior Publication Data

US 2024/0393392 A1 Nov. 28, 2024

(30) Foreign Application Priority Data

May 26, 2023 (IN) .............................. 202341036568

(51) Int. Cl.
| | |
|---|---|
| *G01R 31/3177* | (2006.01) |
| *G01R 31/28* | (2006.01) |
| *G01R 31/3183* | (2006.01) |
| *G01R 31/327* | (2006.01) |
| *G06F 13/16* | (2006.01) |

(52) U.S. Cl.
CPC ....... *G01R 31/3177* (2013.01); *G01R 31/281* (2013.01); *G01R 31/2836* (2013.01); *G01R 31/318342* (2013.01); *G01R 31/3275* (2013.01); *G06F 13/1668* (2013.01); *G06F 2213/0016* (2013.01)

(58) Field of Classification Search
CPC .............. G01R 31/3177; G01R 31/281; G01R 31/2836; G01R 31/318342; G01R 31/3275; G06F 13/1668; G06F 2213/0016
USPC ...................................... 714/735, 25, 55, 742
See application file for complete search history.

(56) References Cited

U.S. PATENT DOCUMENTS

| | | | |
|---|---|---|---|
| 5,581,482 A * | 12/1996 | Wiedenman | ........ G06F 11/3495 714/E11.2 |
| 8,332,690 B1 | 12/2012 | Banerjee et al. | |
| 9,954,727 B2 | 4/2018 | Su et al. | |
| 10,430,260 B2 | 10/2019 | Song | |
| 10,761,926 B2 | 9/2020 | Chien | |
| 11,269,718 B1 | 3/2022 | Chen et al. | |

(Continued)

*Primary Examiner* — John J Tabone, Jr.
(74) *Attorney, Agent, or Firm* — Ray A. King; Frank D. Cimino (57) ABSTRACT

Described embodiments include a fault monitoring system comprising a fault logic circuit having a fault logic input adaptable to be coupled to sensor inputs, and first and second fault logic outputs. The fault logic circuit compares a plurality of data values provided by respective sensor inputs to respective fault thresholds, and provides respective fault signals at the first fault logic output responsive to a fault event in which a respective data value exceeds its respective fault threshold. A timer has a timer input coupled to the reset output, and a timer output. A data register has a first data register input coupled to the write control output, a second data register input coupled to the timer output, and a data register output. The data register receives fault data that includes an event identifier, a timer value, and a timer expiration indicator.

22 Claims, 6 Drawing Sheets

(56) References Cited

U.S. PATENT DOCUMENTS

| | | | |
|---|---|---|---|
| 2007/0300114 A1* | 12/2007 | Doi | G11C 16/0483 |
| | | | 714/738 |
| 2018/0165173 A1 | 6/2018 | Lin et al. | |
| 2021/0141907 A1* | 5/2021 | Kim | G06F 21/52 |
| 2021/0349775 A1 | 11/2021 | Wang et al. | |
| 2022/0200599 A1* | 6/2022 | Hariharan | H03K 21/08 |
| 2023/0333925 A1 | 10/2023 | White et al. | |
| 2024/0069920 A1* | 2/2024 | Foley | G06F 9/30043 |
| 2024/0219540 A1* | 7/2024 | Liao | G01S 7/4811 |

* cited by examiner

| HOTSWAP CONTROLLER STATUS REGISTERS | |
|---|---|
| WARNINGS AND FAULTS | STATUS |
| UNDER VOLTAGE - WARNING | TRUE |
| UNDER VOLTAGE - FAULT | FALSE |
| OVER VOLTAGE - WARNING | TRUE |
| OVER VOLTAGE - FAULT | FALSE |
| OVER CURRENT - WARNING | TRUE |
| OVER CURRENT - FAULT | TRUE |
| OVER CURRENT - TIMER | TRUE |
| OVER TEMPERATURE - WARNING | FALSE |
| OVER TEMPERATURE - FAULT | FALSE |
| OVER POWER - WARNING | FALSE |
| OVER POWER - FAULT | FALSE |

FIG. 3

| RAM LOCATION | EVENT_ID | TMR_EXP | TIMER |
|---|---|---|---|
| 0 | 101 - OC_WARN | 0 | 0100b |
| 1 | 111 - VIN_UV_WARN | 0 | 0000b |
| 2 | 011 - OC_DET | 0 | 1011b |
| 3 | 110 - VIN_OV_WARN | 1 | 0000b |
| 4 | 000 - NONE | 0 | 0000b |
| 5 | 000 - NONE | 0 | 0000b |
| 6 | 000 - NONE | 0 | 0000b |
| 7 | 000 - NONE | 0 | 0000b |

SYSTEM AND METHOD FOR FAULT SEQUENCE RECORDING

CROSS-REFERENCE TO RELATED APPLICATION

This application claims priority to India Patent Application No. 202341036568 filed May 26, 2023, which is incorporated herein by reference in its entirety.

BACKGROUND

This description relates to fault sequence recording, particularly as it is used to record data from particular types of electronic equipment following a system shutdown caused by a power fault condition. The types of systems that may use this type of fault sequence recording can include enterprise server systems and large data processing units such as may be found in remote computing and cloud storage facilities.

As an illustration, aircraft usually contain a black box that records particular information about the airplane including certain important parameters at the time of a plane crash. That information is then read back from the black box to piece together and infer what was happening and how the aircraft was operating at the time of the crash, which may help to understand the cause of the crash. Similarly, certain types of electronic systems may include fault recording systems that are capable of recording particular system parameters and events occurring in the moments leading up to a system shutdown resulting from a power fault condition.

An electronic fuse (efuse) is sometimes used in electric circuits to help protect against power faults such as short circuits, overvoltage conditions, overcurrent conditions, overtemperature, etc. A primary purpose of the efuse is to provide protection to the system in the event of a power fault. In most cases, the system is able to recover from the fault and continue to operate. However, if the system is not able to recover and instead shuts down due to a power fault, some efuses have the capability to store particular system parameters and events occurring in the moments leading up to the failure. This information can be useful for debugging and failure analysis of the system that had the power fault leading to the system shutdown.

SUMMARY

In a first example, a fault monitoring system includes a fault logic circuit having a fault logic input and first and second fault logic outputs. The fault logic input is adaptable to be coupled to sensor inputs. The fault logic circuit is configured to compare a plurality of data values provided by respective sensor inputs to respective fault thresholds, and to provide respective fault signals at the first fault logic output responsive to a fault event in which a respective data value exceeds its respective fault threshold.

A write control circuit has a write control input, a write control output and a reset output. The write control input is coupled to the first fault logic output. A timer has a timer input and a timer output. The timer input is coupled to the reset output. A data register has first and second data register inputs and a data register output, wherein the first data register input is coupled to the write control output, and the second data register input is coupled to the timer output. The data register is configured to receive fault data that includes an event identifier, a timer value, and a timer expiration indicator.

In a second example, a method for monitoring and reporting system faults includes clearing a fault register and setting a fault register address pointer at an initial value. Sensor data values are received at an input of a fault logic circuit. Each respective sensor data value represents a measurement of a respective system parameter. Each respective sensor data value is compared to a respective fault threshold using the fault logic circuit.

Respective fault signals are provided at an output of the fault logic circuit in response to a fault event in which a respective sensor data value exceeds its respective fault threshold. Event information and a time information are recorded for each respective fault event in the fault register, and the fault register address pointer is incremented to a next value. Whether the fault register address pointer is at a maximum address value is determined. The fault register address pointer is reset to the initial value in response to the fault register being at the maximum address value. The event information and the time information are stored in a nonvolatile memory.

DETAILED DESCRIPTION

In this description, the same reference numbers depict same or similar (by function and/or structure) features. The drawings are not necessarily drawn to scale.

An electronic fuse (efuse) is used in numerous types of equipment including enterprise servers and cloud data center server systems. An efuse is an electric circuit that helps protect the system against power faults such as short circuits, overvoltage conditions, overcurrent conditions, overtemperature, etc. In many cases, the system is able to recover and continue normal operation following a power fault. However, if the system is not able to recover and instead shuts down due to the power fault, some efuses have the capability to store potentially helpful information about the events leading up to the failure. This information can be useful for debugging and failure analysis of the system following a power fault leading to a system shutdown.

Some industries, such as remote data servers, place a high importance on reliability of the servers that have to run continuously with no down time. If the enterprise server goes down due to a power fault, being able to detect what happened, troubleshoot the cause of the fault, repair the fault, and try to ensure that the fault does not occur again. For this reason, it is helpful to get information about the fault, and any information that may help trace the fault to its root cause. To do this, it may be important to be able to recreate the sequence of events that led to the power fault and subsequent system shutdown.

Many enterprise server systems have multiple electronic circuit boards plugged into a common power supply or backplane. Some systems require having the capability to remove a circuit board if there is a fault on it and replace it with a new circuit board without shutting down power to the system. That capability is called hotswappability. An important component in a hotswappable system is a hotswap controller which provides some of the functionality to allow a system to continue running live during a hotswap without disturbing the backplane.

A hotswap controller and an efuse perform the same functions, but the efuse is typically a more integrated version of a hotswap controller. So, a hotswap controller may still need some external components such as a current sense resistor and a power transistor. In contrast, an efuse may combine all of this in one packaged device. Either a hotswap controller or an efuse can have the capability to provide protection to the system against power faults, and to record potentially helpful information including electrical parameters and the events leading up to the failure.

Figure 1:
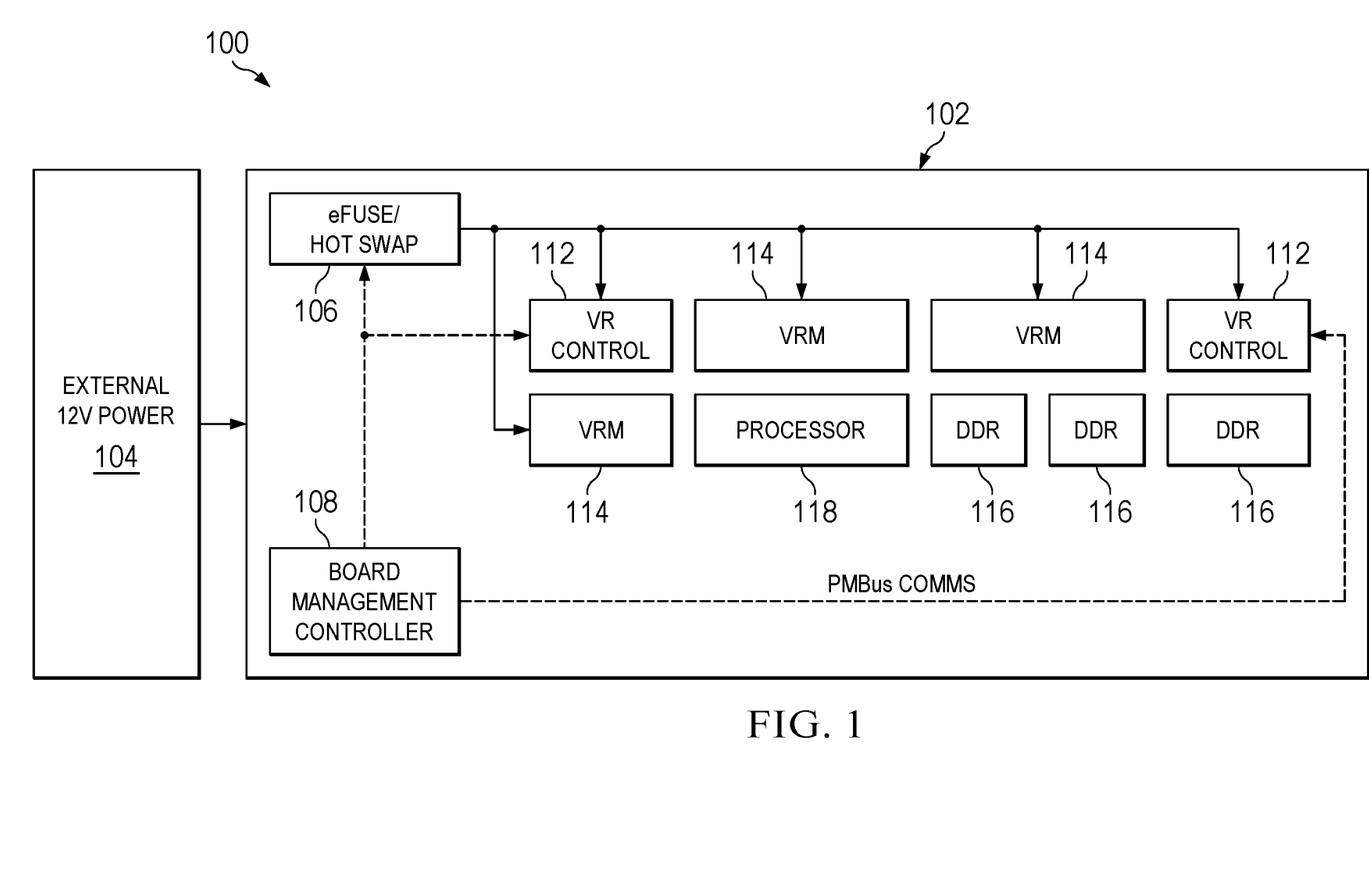
FIG. 1 shows a block diagram for an example enterprise server system.

FIG. 1 shows a block diagram of an example enterprise server system 100. Enterprise server system 100 includes an input power supply 104 and a server motherboard 102. The input power supply 104 is typically a 12V power supply, but may be at a different voltage. Server motherboard 102 includes a hotswap controller 106, voltage regulator (VR) controllers 112, voltage regulator modules (VRMs) 114, dynamic random access memories (DRAMs) 116, processor 118, and a board management controller (BMC) 108. DRAM 116 can be a synchronous dynamic random access memory (SDRAM) or could be a double data rate memory (DDR).

The VRMs 114 receive a voltage provided by input power supply 104 and generate other voltages that are needed to provide power to other system components, such as the processor 118, the DRAMs 116, and system fans. The VRM 114 is the power stage of a voltage regulator that provides drive current for the voltage regulator. The VR controller includes the voltage regulator feedback and control circuitry, and provides control signals to the VRM 114.

The BMC 108 is like a supervisor microcontroller that controls the fault monitoring and reading back information from memory. The BMC 108 continually reads the hotswap controller 106 and saves that information in memory. However, the BMC 108 is only able to keep up if the events being monitored are happening relatively slowly. That is, the BMC 108 is only able to keep up if there is a significant delay from a first event occurrence until the next event occurs. But, many times when a fault occurs, several events happen in quick succession, and the BMC 108 is not able to keep up with all the events. In this case, the information that happens just before the BMC 108 is able to read the data out will be lost, including the sequence in which the events occurred. That is due to the latency of the digital bus between the BMC and the hotswap controller 106, which may be a PM bus.

Because of the latency involved, enterprise server system 100 is not adequate for tracking fault events that are occurring relatively close together in time. If there is a need to track fault events with a fine time resolution (e.g. <1 msec apart), the BMC 108 may not be able to track those faults. Hotswap controller 106 has a digital interface through which parameters such as temperature, voltage, current, and other status information can be read. The other status information may include how well the system was running or if some type of fault had occurred.

The ability to read this information comes through status registers that may show only a single snapshot of the last state before system shutdown. There is no information in that snapshot about the sequence in which the events prior to the system shutdown occurred. In some cases, a timestamp may be added to the information provided in the snapshot. However, the timestamp does not provide any information about relative timing between consecutive individual events. This may not provide a clear indication of the original event and the subsequent events that caused the system failure.

Figure 2:
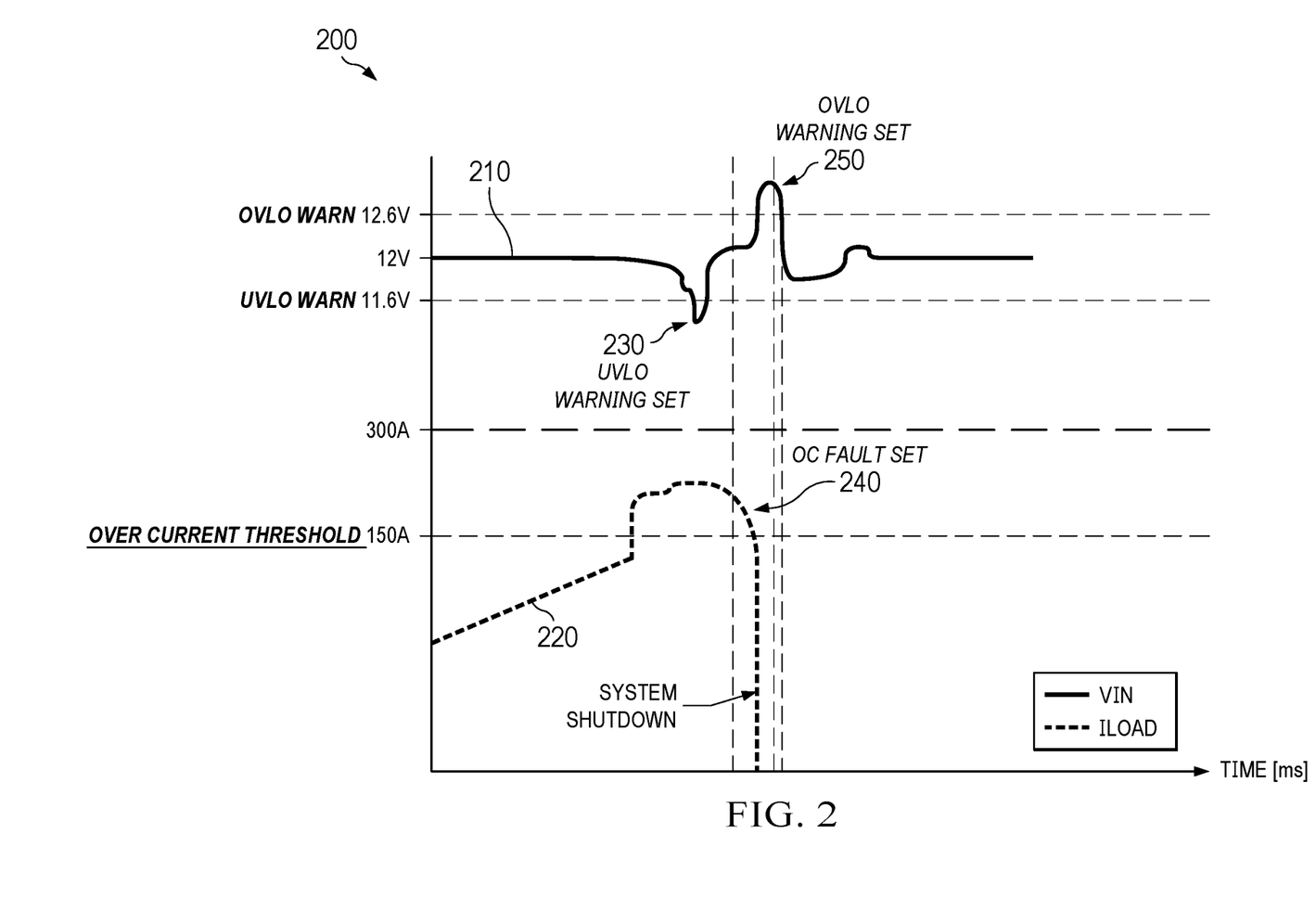
FIG. 2 shows an example graph of events as a function of time for a power fault event in a system, such as a computing server system.

FIG. 2 shows an example graph 200 of events as a function of time for a power fault event in a system, such as a computing server system. Initially at 210, the power supply voltage is stable at 12V and the system is operating normally. At 220, the server demands a burst of current from the power supply. The demand from the server for a burst of current causes the power supply voltage to begin dropping. At 230, the power supply voltage drops below the undervoltage warning threshold, UVLO Warn.

The computing server system had been drawing a particular amount of power, and will act to maintain a constant power draw. So, as the power supply voltage continues to drop, the system begins drawing more current to compensate for the voltage drop. Due to response time, the load current remains above the overcurrent threshold for a longer period of time. This results in the current going higher. With the current remaining high, the efuse or hotswap controller will initiate turning off power to the system because it senses a power fault condition. When the current is interrupted at 240, the power supply voltage rises sharply due to the stored energy in the input inductance. This generates a peak in the power supply voltage. At 250, the power supply voltage rises above the overvoltage warning threshold, OVLO warning.

Figure 3:
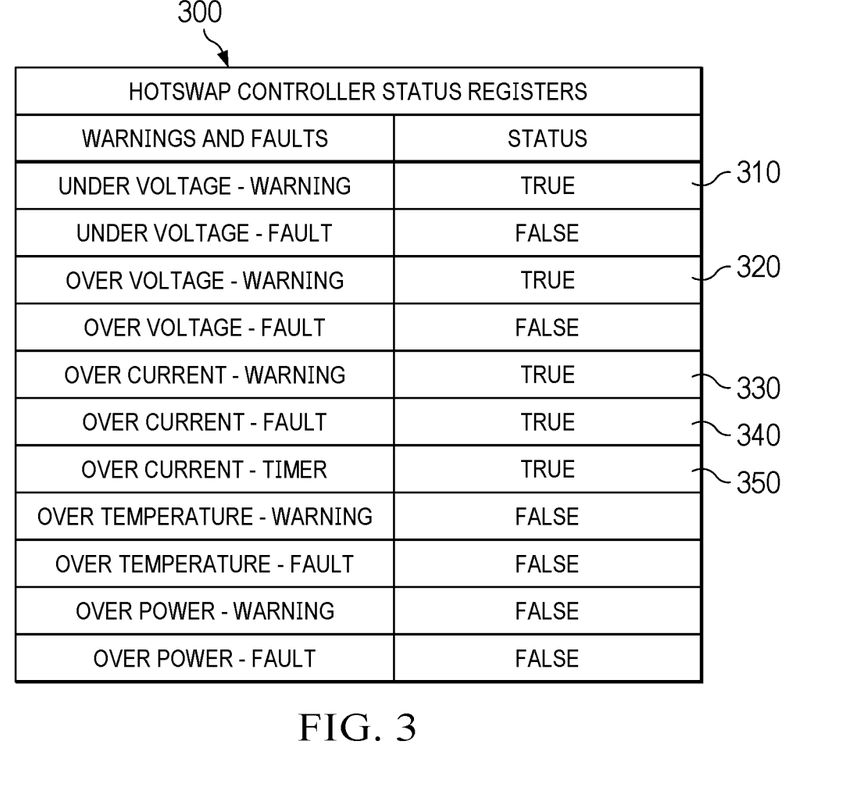
FIG. 3 shows an example controller register map resulting from a system power fault event.

FIG. 3 shows an example controller fault register map 300 resulting from the system power event shown in graph 200. The controller fault register map 300 shows an example fault register map following a typical power fault event. When the server demands a boost of current at 220, the current rises causing the overcurrent warning bit 330 to be set in the register. The current continues to rise until it exceeds the overcurrent threshold, and the overcurrent fault bit 340 is set.

The additional current demand from the server causes the output voltage to drop. When the voltage falls below the UVLO Warning threshold at 230, the undervoltage warning bit 310 is set in the fault register. When the overcurrent threshold is exceeded, the system will shut down and remove the current demand at 240. The output voltage begins rising when the current demand is removed. The output voltage rises, exceeding the overvoltage (OVLO) warning at 250, which sets the overvoltage warning bit 320.

As a result of the system power fault event in 200, particular bits were set in controller fault register map 300. The system power fault led to the power being shut down, a single snapshot was taken of some events that occurred in the system, and that snapshot was stored to be available for later analysis. The bits that were set in controller fault register map 300 included indications of warnings and fault signals occurring as a result of the power fault event occurring. However, only a single snapshot of those events was taken and saved in the fault status register, and that snapshot does not record the sequence in which the faults occurred.

No information is included in the data indicating which event occurred first, which event occurred second, etc., and whether the events happened within 1 microsecond, 1 millisecond, or 10's of seconds of each other. From this snapshot in controller fault register map 300, it may be difficult to determine whether the cause of the system power fault may have been: (1) poor regulation of the power supply; (2) wear and tear of components in the power path; (3) a short circuit; (4) an overcurrent event; or (4) some other cause. Most digital bus interfaces have too large a latency to be able to monitor individual events real-time as they occur, so sending real-time feedback to a separate processor is not a viable option in most cases.

This can make troubleshooting the system and fault analysis very difficult following a power fault event. An examination of controller fault register map 300 shows that four fault bits were set, but do not give adequate information to be able to recreate what happened in the system to cause the power fault event. More than one system fault scenario can cause the same four bits to be set in the system fault register map. So, when debugging and analysis of the power fault event begins, the wrong root cause could be chased, leading to either wasted time and resources or an incorrect conclusion.

Figure 4:
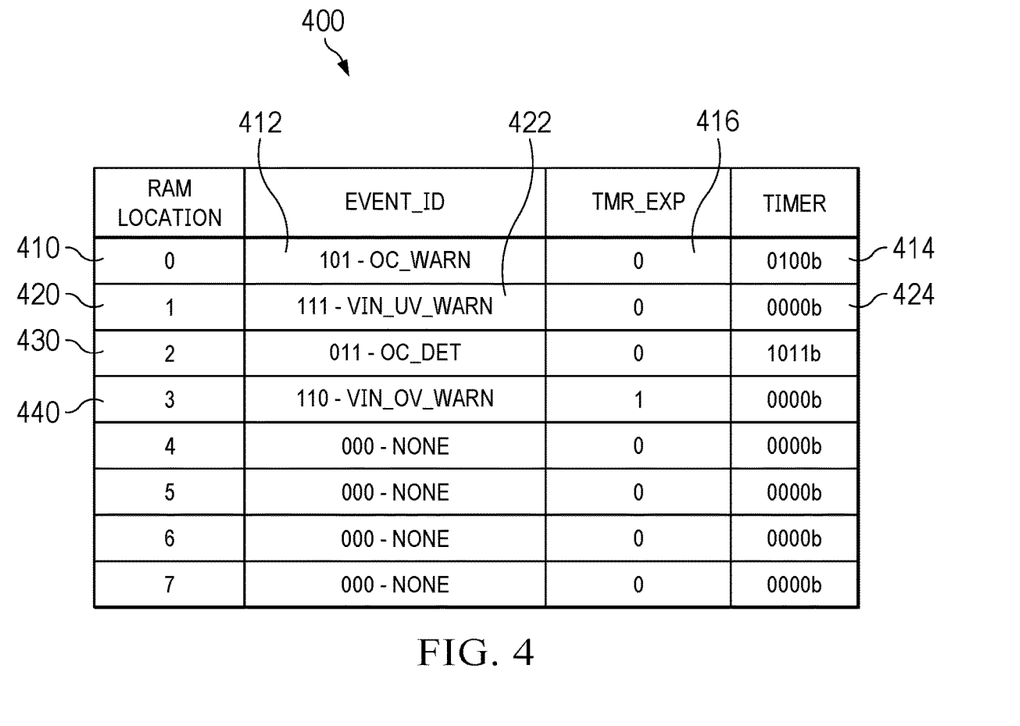
FIG. 4 shows a bitmap for an example fault event sequence RAM buffer resulting from a system power fault event.

FIG. 4 shows a bitmap for an example fault event sequence RAM buffer 400 resulting from a system power fault event. The contents of fault event sequence RAM buffer 400 correspond to the power fault event shown in graph 200. The controller fault register map 300 will also be included in the data provided for debugging and troubleshooting the cause of the power event failure. Fault event sequence RAM buffer 400 does not replace controller fault register map 300, but rather is provided in addition to it. The device is still detecting each of the individual power fault events as they occur. However, not only will the snapshot provided by controller fault register map 300 be stored, but also fault event sequence RAM buffer 400 will be stored in nonvolatile memory for later analysis.

The contents of fault event sequence RAM buffer 400 can be stored in a RAM that is in the same device package as fault event sequence RAM buffer 400. Alternatively, the contents of fault event sequence RAM buffer 400 can be stored in an external RAM. Fault event sequence RAM buffer 400 is updated in a circular buffer manner. Events are recorded individually and sequentially in the buffer. When the end of the buffer is reached, the contents of the buffer are overwritten with the new data. So, the contents of the buffer will always be information about the most recent fault events.

Fault event sequence RAM buffer 400 shows four power fault events. The first power fault event that occurred was power fault event 410, which was an overcurrent (OC) warning. The second power fault event that occurred was power fault event 420, which was an input voltage undervoltage (UV) warning. The third power fault event that occurred was power fault event 430, which was an OC failure. The fourth power fault event that occurred was power fault event 440, which was an input voltage overvoltage (OV) warning.

Initially at system powerup, the fault event sequence RAM buffer 400 is clean and has no entries. When the server demands a burst of current at 220 and causes the current draw to rise above the overcurrent warning threshold, an entry for power fault event 410 is made in RAM location 0 of the fault event sequence RAM buffer 400 recording that an OC warning occurred. The OC warning has a unique three-bit event identifier 412. In this case, the event identifier for an OC warning is 101, the event identifier for a UV warning is 111, and the event identifier for an 0V warning is 110. However, in other cases, other event identifiers can be used.

Additional timing information is also stored in fault event sequence RAM buffer 400. The timing information is saved in two fields. The first timing information field is a timer value field 414, and the second timer information field is a timer expiration field 416. The timer value field 414 provides a four-bit value representing an incremental time from the previous power fault event to the current power fault event. The timer expiration field 416 provides a true/false indication of whether the time between the previous power fault event and the current power fault event exceeded the four-bit timer value and restarted at 0000b.

In at least one case, the timer is a clock inside the device that provides an absolute time in a format such as date/hour/min/sec that the power fault event occurred. However, in many other examples, the device uses a free-running counter derived from a master reference clock having a known frequency. In the case of a free-running clock, clock pulses are counted to determine how many clock ticks elapsed between the previous power fault event and the current power fault event. This provides the relative timing between the two events. From power fault event 410 to power fault event 420, no timer ticks occurred according to timer indicator 424. From power fault event 420 to power fault event 430, eleven (1011b) timer ticks occurred. From power fault event 430 to power fault event 440, no timer ticks occurred.

Some finite time elapsed between power fault event 410 and power fault event 420, and between power fault event 430 and power fault event 440. However, the timer tick count is also a function of the resolution of the timer. If the timer is ticking at a rate of 1 millisecond per tick, any events that happen within 1 millisecond of each other will always report as zero elapsed time. But, if the timer period is 1 microsecond, there will be many more timer ticks between the same two events.

The tick value, or the time between consecutive timer ticks, is set by the frequency of a master clock (e.g. 12 MHz) and a clock divider. The clock divider divides the master clock frequency down to a lower frequency to generate a slower timer, or a longer time between timer ticks (e.g. 50 microsecond to 3.2 millisecond). The value for the clock divider may be user-programmable by writing to a clock register to set the clock division factor, or it may be fixed in hardware at a particular clock division factor.

If cost and silicon area were not important considerations, the fault event sequence RAM buffer 400 could be made large enough to store all the power events that occur during the lifetime of the system, and circuitry could be added to provide an absolute timestamp on every event. However, many systems require economical cost and space optimization. The bit mapping of fault event sequence RAM buffer 400 provides a relatively large amount of information to be stored into a single byte.

The event information for each of power fault event 410, power fault event 420, power fault event 430 and power fault event 440 is stored in just one byte for each of the power fault events. This one byte of information includes a three-bit event identifier, a four-bit timer value, and a one-bit timer expiration bit. Because there is only a finite number of bits for storing the timer information, some information about the timer may be lost if the time between events is too long, and the timer runs from 0000b to 1111b, followed by the register value then returning to 0000b.

So, if the power fault events occur far enough apart in time, the timer may overflow and reset to 0000b and then continue counting up. Depending on when the snapshot is taken, the timer may have expired multiple times, and the value being recorded in the timer field of fault event sequence RAM buffer 400 may not be correct. The timer expiration bit (e.g. 416) indicates whether the timer has run over at least one time. The timer expiration bit provides information to help determine if the previous power fault event happened in the near past or a longer time in the past relative to the current power fault event.

A '0' in the timer expiration field means that the timer did not expire between the previous event and the current event. Therefore, the time shown in the timer field is the actual number of timer ticks that have occurred between the previous power fault event and the current power fault event. A '1' in the timer expiration field means that the timer expired at least once between the previous event and the current event. It does not provide information on how many times the timer expired during that period, but only that it did expire. In this case, it is known that the timer value is a coarse value instead of an exact value, and that the time between the two events is more than or equal to the maximum time of 16×(4 bits) a clock tick period.

Figure 5:
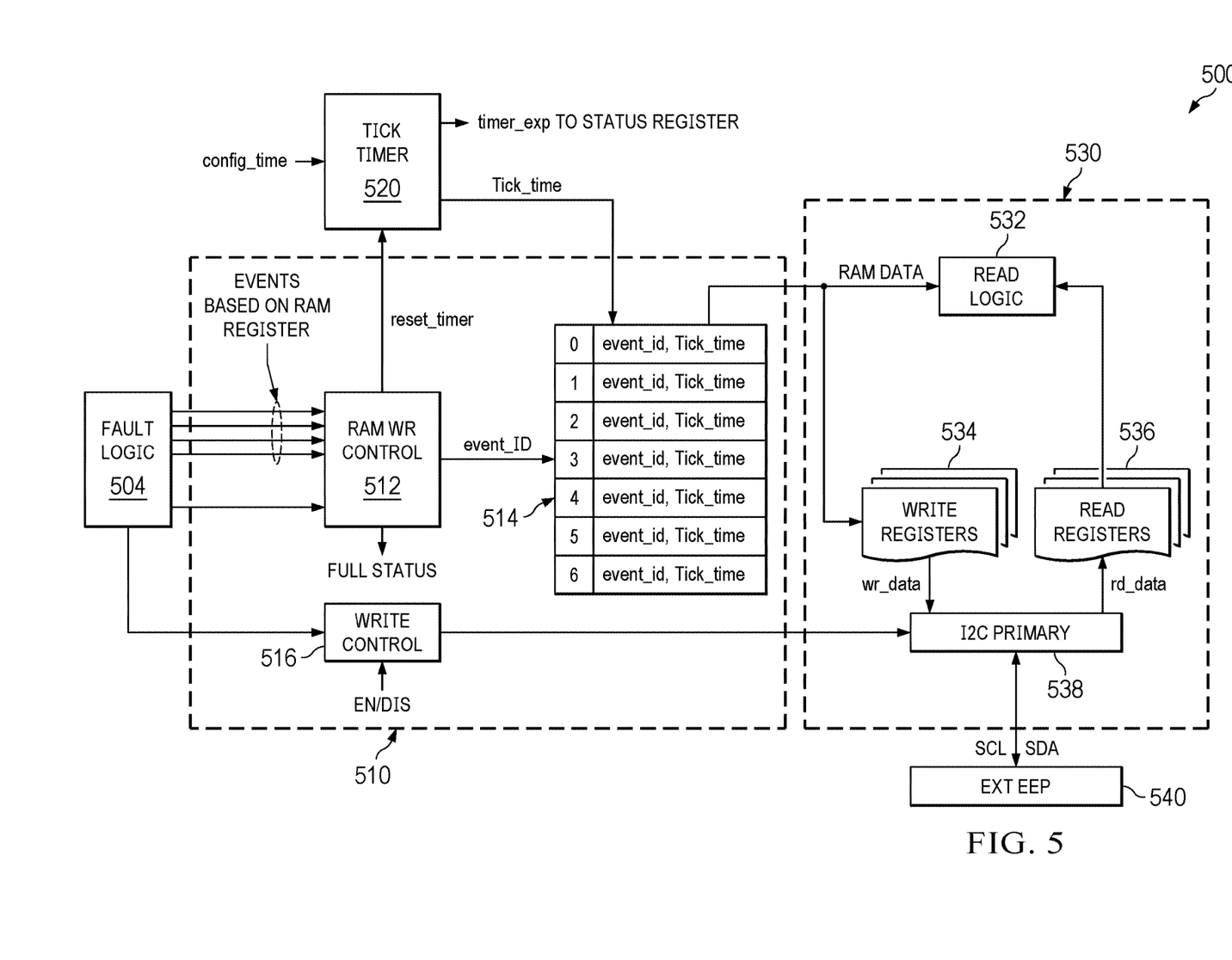
FIG. 5 shows a block diagram for an example fault sequence recording system according to the present invention.

FIG. 5 shows a block diagram for an example fault sequence recording system 500 according to the present invention. Fault sequence recording system 500 is made up of four subsystems. The four subsystems include a fault logic block 504, an event identification and RAM storage subsystem 510, a tick timer 520, and a memory control subsystem 530.

The event identification and RAM storage subsystem 510 includes a RAM write control block 512, a write control block 516, and a fault event sequence RAM buffer 514. The memory control subsystem 530 includes a read logic block 532, write registers 534, and read registers 536. In some cases, the memory control subsystem 530 may also include an I2C interface block 538, but I2C interface block 538 may not be necessary in other cases.

The fault logic block 504 has first and second outputs coupled to the event identification and RAM storage subsystem 510 at the RAM write control block 512 and the write control block 516, respectively. The RAM write control block has first and second outputs coupled to the fault event sequence RAM buffer 514 and the tick timer 520, respectively. Tick timer block 520 has an output coupled to an input of the fault event sequence RAM buffer 514.

The fault event sequence RAM buffer 514 has first and second outputs coupled to the memory control subsystem 530 at inputs of the read logic block 532 and the write registers 534, respectively. The read registers 536 have an output coupled to a second input of read logic block 532. The I2C interface block 538 has first and second inputs and an output. The first and second inputs of I2C interface block 538 are coupled to outputs of the write registers 534 and the write control block 516, respectively. In some cases, the I2C interface block 538 is also coupled to an external EEPROM 540.

Fault sequence recording system 500 system receives inputs from sensors (not shown) that monitor important parameters such as input and output voltages, current draw, and temperature. Fault logic block 504 receives information from outputs of the voltage, current, and temperature monitors and compares those parameters to their respective thresholds and warning limits. Other example systems may have different monitors or additional monitors that provide information to the fault logic block 504.

Fault logic block 504 has an output coupled to the input of RAM write control block 512. When a fault occurs, the fault logic block 504 provides information to RAM write control block 512 about the fault. The information that the fault logic block 504 provides to the RAM write control block 512 includes what fault occurred. But, there is no timing information included with the information from the fault logic block 504, so it is just a synchronous event. However, the RAM write control block 512 can get timing information from the tick timer 520. So, the RAM write control block 512 is able to provide information of what fault event occurred and how many ticks of the tick timer elapsed from the previous fault event until it occurred.

In another example implementation, the information of how many ticks of the tick timer elapsed between the previous fault event and the current fault event can be provided directly to the fault event sequence RAM buffer 514 by the tick timer 520. The RAM write control block 512 then resets the tick timer 520 after an event occurs and is recorded into the fault event sequence RAM buffer 514.

The fault event sequence RAM buffer 514 is a volatile memory, so loses its contents when power is removed. Therefore, it is necessary to write the information contained in the fault event sequence RAM buffer 514 to a non-volatile memory for help in troubleshooting and determining the cause of the power fault event. The nonvolatile memory may be included within the same device as the fault event sequence RAM buffer 514, or it may be external to the device, such as an external EEPROM 540.

The operation of writing the contents of the fault event sequence RAM buffer 514 to nonvolatile memory is performed by the memory control subsystem 530. If the device senses that it is losing power, the fault event sequence RAM buffer 514 writes its contents into write register 534. In the case of an external nonvolatile memory, write register 534 communicates with the external EEPROM 540 through an interface, such as I2C interface 538. In other cases, the nonvolatile memory may be an EEPROM, flash memory. or some other type of one-time-programmable (OTP) memory inside the device. The read logic block 532 allows reading back into the device information that is stored in the system, or to read back the contents of the nonvolatile memory.

Figure 6:
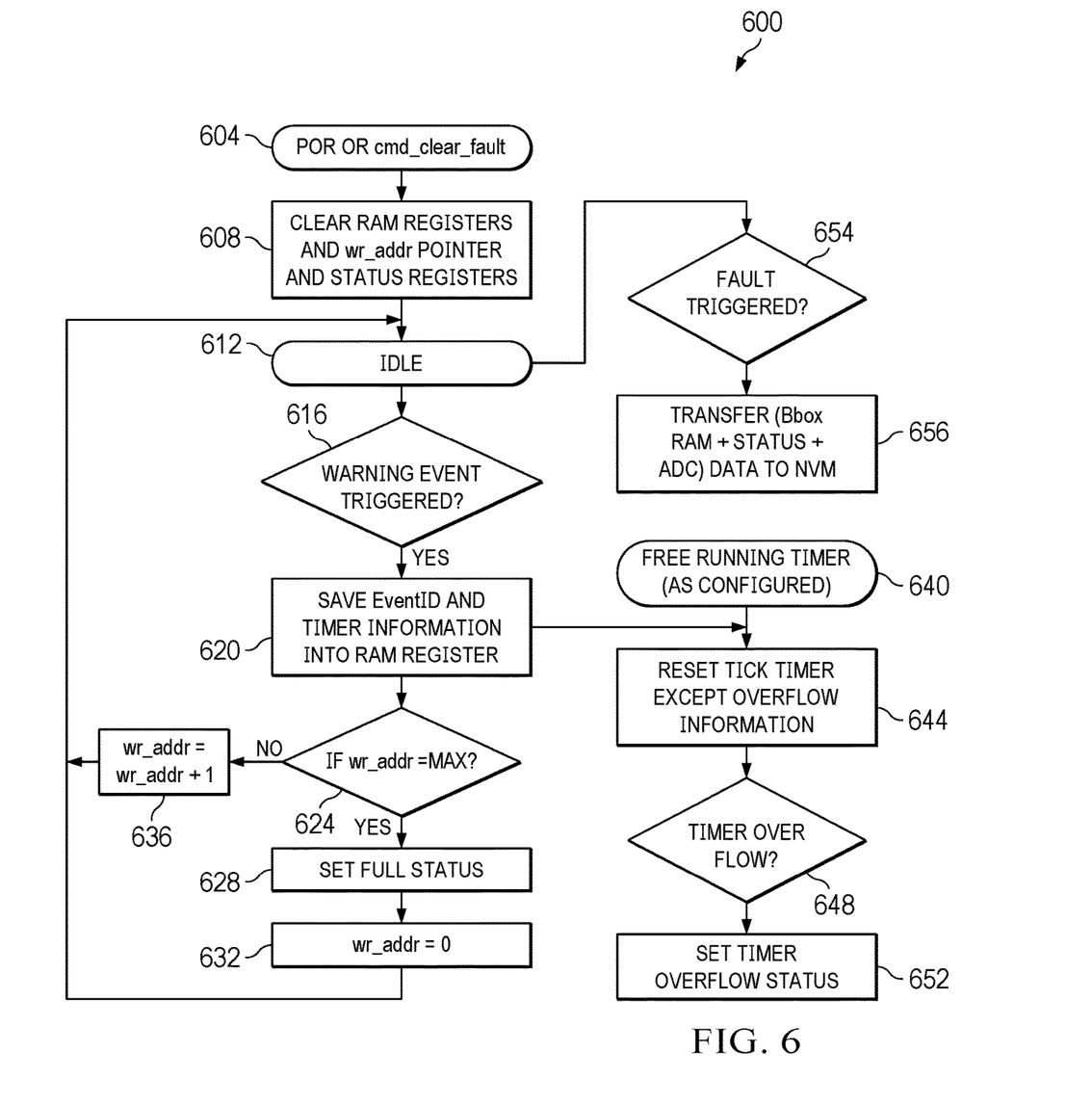
FIG. 6 shows a flow chart for an example fault sequence recording method according to the present invention.

FIG. 6 shows a flow chart for an example fault sequence recording method 600 according to the present invention. At 604, the system receives a power-on-reset (POR) initiating operation of the system. At this point, the system turns on and all the RAM and status bits are cleared and set to their default values (e.g. zero) at 608. At 612, the system is running idle, and continues in an idle state until a fault event occurs.

When a first fault event occurs at 616, the fault logic is awakened and determines whether the fault event is an event that is recognized. If the fault event is a recognized event, the event identification (ID) and the timer information are saved into the RAM registers at 620. At 624, the RAM register pointer value is queried to determine if the contents of the RAM register are full. If the RAM register is not full, the RAM register pointer is incremented to the next value at 636. If the RAM register is full, the full status bit is set at 628 and the RAM register pointer value is reset to zero. The system then returns to idle at 612 and remains at idle until the next fault event occurs.

At 640, the timer is free-running while the system is operating. The time between ticks will be determined by how it is configured through the master clock frequency and the clock divider ratio. If a recognized fault event occurs at 620, then the free-running timer records its tick value and is then reset to zero at 644.

At 648, the timer value is queried to determine if a timer register overflow occurred and the tick value register had been reset to zero at least once. If an overflow of the tick value register occurs between the last fault event and the current fault event, the overflow bit will be set in the RAM register. When a fault event is detected at 654, the fault ID and timer information are written to nonvolatile memory at 656 to be available for later retrieval and analysis.

In this description, "terminal," "node," "interconnection," "lead" and "pin" are used interchangeably. Unless specifically stated to the contrary, these terms generally mean an interconnection between or a terminus of a device element, a circuit element, an integrated circuit, a device, or other electronics or semiconductor component.

In this description, "ground" includes a chassis ground, an Earth ground, a floating ground, a virtual ground, a digital ground, a common ground and/or any other form of ground connection applicable to, or suitable for, the teachings of this description.

In this description, the term "couple" may cover connections, communications or signal paths that enable a functional relationship consistent with this description. For example, if device A generates a signal to control device B to perform an action, then: (a) in a first example, device A is coupled to device B by direct connection; or (b) in a second example, device A is coupled to device B through intervening component C if intervening component C does not alter the functional relationship between device A and device B, so device B is controlled by device A via the control signal generated by device A.

In this description, even if operations are described in a particular order, some operations may be optional, and the operations are not necessarily required to be performed in that particular order to achieve specified results. In some examples, multitasking and parallel processing may be advantageous. Moreover, a separation of various system components in the embodiments described above does not necessarily require such separation in all embodiments.

Modifications are possible in the described embodiments, and other embodiments are possible, within the scope of the claims.

What is claimed is:

1. A fault monitoring system comprising:
   a fault logic circuit having a fault logic input and first and second fault logic outputs, wherein the fault logic input is adaptable to be coupled to sensor inputs, and the fault logic circuit is configured to compare a plurality of data values provided by respective sensor inputs to respective fault thresholds, and to provide respective fault signals at the first fault logic output responsive to a fault event in which a respective data value exceeds its respective fault threshold;
   a write control circuit having a write control input, a write control output and a reset output, wherein the write control input is coupled to the first fault logic output;
   a timer having a timer input and a timer output, wherein the timer input is coupled to the reset output; and
   a data register having first and second data register inputs and a data register output, wherein the first data register input is coupled to the write control output, and the second data register input is coupled to the timer output;
   wherein the data register is configured to receive fault data that includes an event identifier, a timer value, and a timer expiration indicator.

2. The fault monitoring system of claim 1, wherein the fault data is one byte, the event identifier is 3 bits, the timer value is 4 bits, and the timer expiration indicator is 1 bit.

3. The fault monitoring system of claim 1, wherein the data values include values for voltage and current.

4. The fault monitoring system of claim 3, wherein the fault event is one of: an overvoltage fault, an undervoltage fault, an overcurrent fault, and a temperature fault.

5. The fault monitoring system of claim 1, wherein the timer output provides an indication of a time between a first fault event and a second fault event.

6. The fault monitoring system of claim 1, wherein the timer output provides an indication of an absolute time that each respective fault event occurred.

7. The fault monitoring system of claim 1, wherein the data register output is coupled to a nonvolatile storage that is configurable to receive fault data provided by the data register output.

8. The fault monitoring system of claim 7, further comprising a nonvolatile write control circuit having a nonvolatile write control input and a nonvolatile write control output, wherein the nonvolatile write control input is coupled to the second fault logic output, and the nonvolatile write control output is coupled to the nonvolatile storage.

9. The fault monitoring system of claim 7, wherein the data register output is coupled to the nonvolatile storage through a bus interface.

10. The fault monitoring system of claim 9, wherein the bus interface is an I2C bus interface.

11. The fault monitoring system of claim 7, wherein the nonvolatile storage is one of: an electrically erasable programmable read only memory (EEPROM), a flash memory, and a one-time-programmable (OTP) memory.

12. A method for monitoring and reporting system faults, comprising:
    clearing a fault register and setting a fault register address pointer at an initial value;
    receiving sensor data values at an input of a fault logic circuit, wherein each respective sensor data value represents a measurement of a respective system parameter;
    comparing each respective sensor data value to a respective fault threshold using the fault logic circuit;
    providing respective fault signals at an output of the fault logic circuit responsive to a fault event in which a respective sensor data value exceeds its respective fault threshold;
    recording an event information and a time information for each respective fault event in the fault register, and incrementing the fault register address pointer to a next value;
    determining whether fault register address pointer is at a maximum address value, and resetting the fault register address pointer to the initial value responsive to the fault register being at the maximum address value; and
    storing the event information and the time information in a nonvolatile memory.

13. The method of claim 12, wherein the event information includes an event identifier, a timer value, and a timer expiration indicator.

14. The method of claim 13, wherein the event identifier is 3 bits, the timer value is 4 bits, and the timer expiration indicator is 1 bit.

15. The method of claim 13, wherein the timer value provides an indication of an absolute time that each respective fault event occurred.

16. The method of claim 14, wherein the timer value provides an indication of a time between a first fault event and a second fault event.

17. The method of claim 16, wherein the time between the first fault event and the second fault event is determined by counting a number of clock cycles occurring between the first fault event and the second fault event.

18. The method of claim 17, wherein the timer expiration indicator provides an indication whether the timer value reached a maximum timer value during the counting.

19. The method of claim 18, further comprising resetting the timer value in response to the timer value reaching the timer maximum value.

20. The method of claim 12, wherein the sensor data values include values for voltage and current.

21. The method of claim 20, wherein the fault event is one of: an overvoltage fault, an undervoltage fault, an overcurrent fault, and a temperature fault.

22. The method of claim 12, wherein the nonvolatile memory is one of: an electrically erasable programmable read only memory (EEPROM), a flash memory, and a one-time-programmable (OTP) memory.

\* \* \* \* \*